US012727152B2

(12) United States Patent
Kwon et al.

(10) Patent No.: US 12,727,152 B2
(45) Date of Patent: Sep. 1, 2026

(54) SEMICONDUCTOR DEVICE AND METHOD FOR FABRICATING THE SAME

(71) Applicant: SK hynix Inc., Gyeonggi-do (KR)

(72) Inventors: Jung Min Kwon, Gyeonggi-do (KR); Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 858 days.

(21) Appl. No.: 17/974,096

(22) Filed: Oct. 26, 2022

(65) Prior Publication Data

US 2023/0317119 A1 Oct. 5, 2023

(30) Foreign Application Priority Data

Mar. 29, 2022 (KR) ........................ 10-2022-0038917

(51) Int. Cl.
*H10B 12/00* (2023.01)
*G11C 5/06* (2006.01)

(52) U.S. Cl.
CPC ........... *H10B 12/488* (2023.02); *G11C 5/063* (2013.01); *H10B 12/30* (2023.02)

(58) Field of Classification Search
CPC ....... G11C 11/4097; G11C 5/063; G11C 8/14; H10B 12/02; H10B 12/05; H10B 12/09; H10B 12/30; H10B 12/488; H10B 12/50
See application file for complete search history.

(56) References Cited

U.S. PATENT DOCUMENTS

| | | | |
|---|---|---|---|
| 11,094,699 B1 * | 8/2021 | Brewer | H10D 62/121 |
| 2012/0170368 A1 * | 7/2012 | Lee | H10B 43/50 365/185.05 |
| 2021/0183862 A1 | 6/2021 | Son et al. | |

FOREIGN PATENT DOCUMENTS

KR 10-1113766 B1 2/2012

OTHER PUBLICATIONS

Office Action for Korean Patent Application No. 10-2022-0038917 issued by the Korean Patent Office on Jun. 5, 2026.

* cited by examiner

*Primary Examiner* — Sue A Purvis
*Assistant Examiner* — Kevin Quinto
(74) *Attorney, Agent, or Firm* — IP&T GROUP LLP

(57) ABSTRACT

A semiconductor device includes: a first word line stack in which first word lines are vertically stacked; a second word line stack in which second word lines are vertically stacked; a word line isolation slit disposed between the first word line stack and the second word line stack; and a first vertical isolation layer disposed between the first word line stack and the second word line stack and overlapping with the word line isolation slit.

20 Claims, 12 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2022-0038917, filed on Mar. 29, 2022, which is incorporated herein by reference in its entirety.

BACKGROUND

1. Field

Embodiments of the present invention relate to a semiconductor device, and more particularly, to a semiconductor device having a three-dimensional structure and a method for fabricating the same.

2. Description of the Related Art

The size of a memory cell is being continuously reduced to increase the net die of a memory device. As the size of memory cells is miniaturized, it is required to reduce parasitic capacitance and increase the capacitance as well. However, it is difficult to increase the net die due to the structural limitation of the memory cells.

Recently, three-dimensional semiconductor memory devices including memory cells that are arranged in three dimensions are being considered.

SUMMARY

Embodiments of the present invention are directed to a semiconductor device having highly integrated memory cells and a method for fabricating the semiconductor device.

In accordance with one embodiment of the present invention, a semiconductor device may include: a first word line stack in which first word lines are vertically stacked; a second word line stack in which second word lines are vertically stacked; a word line isolation slit disposed between the first word line stack and the second word line stack; and a first vertical isolation layer disposed between the first word line stack and the second word line stack and overlapping with the word line isolation slit.

In accordance with another embodiment of the present invention, a semiconductor device may include: a first linear edge slit; a second linear edge slit; a word line isolation slit; a first word line stack disposed between the first linear edge slit and the word line isolation slit; a second word line stack disposed between the first linear edge slit and the word line isolation slit; and a plurality of vertical isolation layers having protrusions overlapping with respective edges of the first linear edge slit, the second linear edge slit, the word line isolation slit.

DETAILED DESCRIPTION

Figure 1:
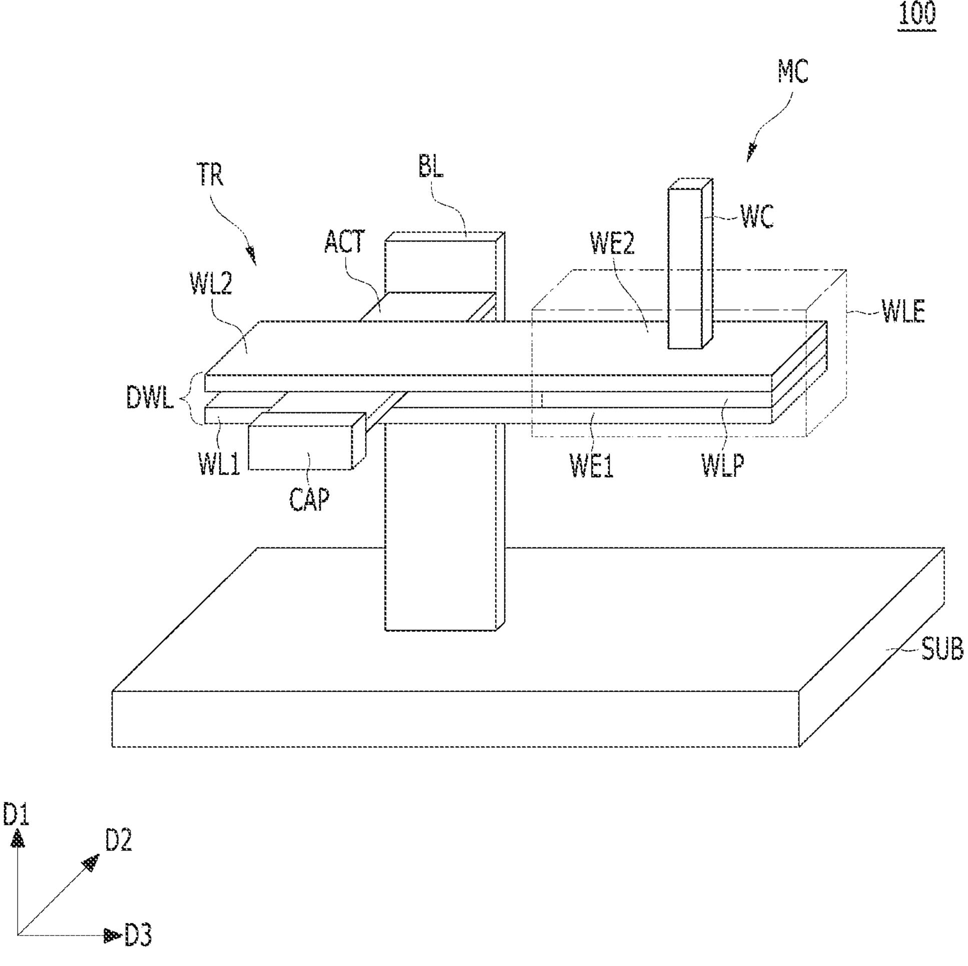
FIG. 1 is a schematic perspective view of a semiconductor device in accordance with one embodiment of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like portions throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to the following embodiments of the present invention, the density of memory cells may be increased and parasitic capacitance may be reduced by vertically stacking memory cells.

Figure 2:
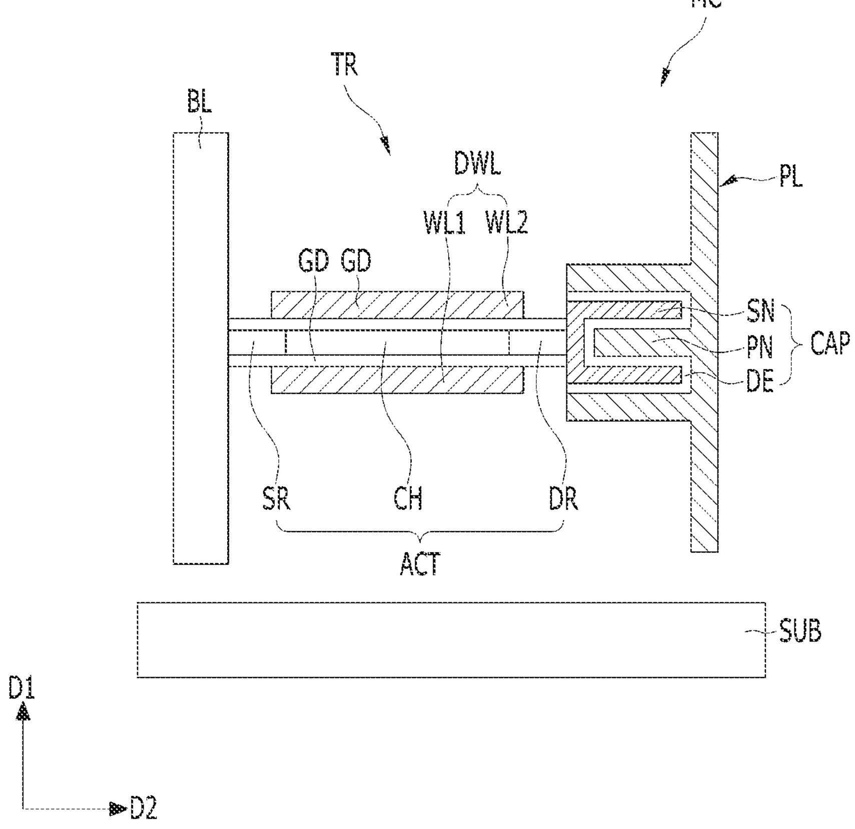
FIG. 2 is a schematic cross-sectional view illustrating a memory cell shown in FIG. 1.

FIG. 1 is a schematic perspective view of a semiconductor device in accordance with one embodiment of the present invention. FIG. 2 is a schematic cross-sectional view illustrating a memory cell shown in FIG. 1.

Referring to FIG. 1, the semiconductor device 100 may include a substrate SUB, a conductive line stack DWL including a plurality of first conductive lines WL1 and WL2 that are stacked over the substrate SUB in a direction perpendicular to the surface of the substrate SUB, a contact plug WC contacting an edge portion WLE of the conductive line stack DWL, a second conductive line BL extending in the direction perpendicular to the surface of the substrate SUB over the substrate SUB, and a laterally oriented conductive layer ACT that is laterally oriented in a direction crossing the first conductive lines WL1 and WL2. The semiconductor device 100 may further include a conductive pad WLP disposed at the edge portion WLE of the first conductive lines WL1 and WL2. The edge portion WLE of the conductive line stack DWL may include a first edge portion WE1 and a second edge portion WE2. The first conductive lines WL1 and WL2 may include a lower-level first conductive line WL1 and an upper-level first conductive line WL2. The conductive line stack DWL may include a pair of the lower-level first conductive line WL1 and the upper-level first conductive line WL2. The first edge portion WE1 may refer to an edge portion of the lower-level first conductive line WL1, and the second edge portion WE2 may refer to an edge portion of the upper-level first conductive line WL2. The conductive pad WLP may be disposed between the first edge portion WE1 of the lower-level first conductive line WL1 and the second edge portion WE2 of the upper-level first conductive line WL2. The contact plug WC may be coupled to the second edge portion WE2 of the upper-level first conductive line WL2. The lower-level first conductive line WL1 may be disposed on the lower surface of the laterally oriented conductive layer ACT, and the upper-level conductive line WL2 may be disposed on the upper surface of the laterally oriented conductive layer ACT.

The semiconductor device 100 may include a memory cell MC, and the memory cell MC may include a DRAM memory cell. Hereinafter, the first conductive lines WL1 and WL2 may be referred to as first and second word lines WL1 and WL2, and the second conductive line BL may be referred to as a bit line BL. The conductive line stack DWL may be referred to as a word line DWL, and the conductive pad WLP may be referred to as a word line pad WLP. The laterally oriented conductive layer ACT may be referred to as an active layer ACT. The word line DWL may have a double word line structure. For example, the word line DWL may include a pair of a first word line WL1 and a second word line WL2, and the first word line WL1 and the second word line WL2 may be oriented laterally with the active layer ACT interposed therebetween.

Referring to FIGS. 1 and 2, the semiconductor device 100 may include the substrate SUB and the memory cell MC. The memory cell MC may be disposed at a higher level than the substrate SUB. The memory cell MC may include a bit line BL, a transistor TR, and a data storage element CAP. The transistor TR may include the active layer ACT and the word line DWL, and the word line DWL may include the first word line WL1 and the second word line WL2 that are facing each other with the active layer ACT interposed therebetween. The data storage element CAP may be memory elements capable of storing data. The data storage element CAP may include a capacitor. Hereinafter, the data storage element CAP may be referred to as a capacitor CAP.

The capacitor CAP may include a storage node SN, a dielectric layer DE, and a plate node PN. The memory cell MC may include one double word line structure.

The bit line BL may extend in a first direction D1 which is perpendicular to the surface of the substrate SUB. The active layer ACT may extend in a second direction D2 which is parallel to the surface of the substrate SUB. The word line DWL may extend in a third direction D3 which is parallel to the surface of the substrate SUB, and the third direction D3 may intersect with the first and second directions D1 and D2.

The bit line BL may be vertically oriented in the first direction D1. The bit line BL may be referred to as a vertically oriented bit line or a pillar-type bit line. The bit line BL may include a conductive material. The bit line BL may include a silicon-based material, a metal-based material, or a combination thereof. The bit line BL may include silicon, a metal, a metal nitride, a metal silicide, or a combination thereof. The bit line BL may include polysilicon, titanium nitride, tungsten, or a combination thereof. For example, the bit line BL may include polysilicon or titanium nitride (TiN) which is doped with an N-type impurity. The bit line BL may include titanium nitride and tungsten. For example, the bit line BL may include a TiN/W stack, and the TiN/W stack may include titanium nitride and tungsten over the titanium nitride.

The word line DWL may extend in the third direction D3, and the active layer ACT may extend in the second direction D2. The active layer ACT may be arranged laterally along the second direction D2 from the bit line BL. The word line DWL may include a pair of word lines, for example, a first word line WL1 and a second word line WL2. The first word line WL1 and the second word line WL2 may face each other vertically in the first direction D1 with the active layer ACT interposed therebetween.

The active layer ACT may be laterally oriented between the bit line BL and the capacitor CAP. A first side of the active layer ACT may be coupled to the bit line BL, and a second side of the active layer ACT may be coupled to the capacitor CAP. The active layer ACT may include a semiconductor material or an oxide semiconductor material. For example, the active layer ACT may include silicon, monocrystalline silicon, polysilicon, germanium, silicon-germanium, or indium gallium zinc oxide (IGZO).

The active layer ACT may include a channel CH, a first source/drain region SR between the channel CH and the bit line BL, and a second source/drain region DR between the channel CH and the capacitor CAP. The channel CH may be defined between the first source/drain region SR and the second source/drain region DR. The channel CH and the word line DWL may vertically overlap with each other in the first direction D1. The channel CH may extend laterally in the second direction D2.

The first source/drain region SR and the second source/drain region DR may be doped with impurities of the same conductivity type. The first source/drain region SR and the second source/drain region DR may be doped with an N-type impurity or a P-type impurity. The first source/drain region SR and the second source/drain region DR may include at least one impurity selected among arsenic (As), phosphorus (P), boron (B), indium (In), and a combination thereof. The first source/drain region SR may contact the bit line BL, and the second source/drain region DR may contact a storage node SN of the capacitor CAP.

The transistor TR may be a cell transistor, and it may have a word line DWL. In the word line DWL, the first word line WL1 and the second word line WL2 may have the same potential. For example, the first word line WL1 and the second word line WL2 may form a pair, and the same word line driving voltage may be applied to the first word line WL1 and the second word line WL2. The first word line WL1 and the second word line WL2 may be coupled to each other by the word line pad WLP, and the same word line driving voltage may be applied by a contact plug WC.

As described above, the memory cell MC in accordance with one embodiment of the present invention may include two word lines WL1 and WL2 and one channel CH. In other words, the memory cell MC may have a word line DWL of a double word line structure in which the first and second word lines WL1 and WL2 are disposed facing one channel CH.

The active layer ACT may have a smaller thickness than either of the first and second word lines WL1 and WL2. In other words, the vertical thickness of the active layer ACT in the first direction D1 may be smaller than the vertical thickness of either of the first and second word lines WL1 and WL2 in the first direction D1. Such a thin active layer ACT may be referred to as a thin-body active layer. The thin active layer ACT may include a thin-body channel CH, and the thin-body channel CH may have a thickness for example of approximately nm or less. According to another embodiment of the present invention, the channel CH may have the same vertical thickness as those of the first and second word lines WL1 and WL2.

The upper and lower surfaces of the active layer ACT may have a flat-surface. In other words, the upper surface and the lower surface of the active layer ACT may be parallel to each other in the second direction D2.

A gate dielectric layer GD may be formed between the first and second word lines WL1 and WL2 and the active layer ACT. The gate dielectric layer GD may include silicon oxide, silicon nitride, a metal oxide, a metal oxynitride, a metal silicate, a high-k material, a ferroelectric material, an anti-ferroelectric material or a combination thereof. The gate dielectric layer GD may include $SiO_2$, $Si_3N_4$, $HfO_2$, $Al_2O_3$, $ZrO_2$, AlON, HfON, HfSiO, HfSiON, or HfZrO.

Each of the first and second word lines WL1 and WL2 may include a metal, a metal mixture, a metal alloy, or a semiconductor material. Each of the first and second word lines WL1 and WL2 may include titanium nitride, tungsten, polysilicon, or a combination thereof. For example, each of the first and second word lines WL1 and WL2 may include a TiN/W stack in which titanium nitride and tungsten are sequentially stacked. Each of the first and second word lines WL1 and WL2 may include an N-type work function material or a P-type work function material. The N-type work function material may have a low work function of approximately 4.5 eV or less, and the P-type work function material may have a high work function of approximately 4.5 eV or more.

The capacitor CAP may be disposed laterally from the transistor TR in the second direction D2. The capacitor CAP may include a storage node SN that extends laterally from the active layer ACT in the second direction D2. The capacitor CAP may further include a dielectric layer DE and a plate node PN over the storage node SN. The storage node SN, the dielectric layer DE, and the plate node PN may be arranged laterally in the second direction D2. The storage node SN may have a laterally oriented cylinder shape. The dielectric layer DE may conformally cover the cylindrical inner wall and the cylindrical outer wall of the storage node SN. The plate node PN may have a shape extending to the cylindrical inner side and the cylindrical outer side of the storage node SN over the dielectric layer DE. For example, the plate node PN may include an inner node disposed inside the cylinder of the storage node SN and a plurality of outer nodes surrounding the outside of the storage node SN. The storage node SN may be electrically connected to the second source/drain region DR. The plate node PN may be coupled to the plate line PL. The plate node PN and the plate line PL may be formed of the same material, and the plate node PN and the plate line PL may have an integrated structure.

The storage node SN may have a three-dimensional structure, and the storage node SN of the three-dimensional structure may have a lateral three-dimensional structure which is oriented in the second direction D2. As an example of the three-dimensional structure, the storage node SN may have a cylindrical shape. According to another embodiment of the present invention, the storage node SN may have a pillar shape or a pylinder shape. The pylinder shape may refer to a structure in which a pillar shape and a cylindrical shape are merged.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, and a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node SN over the titanium nitride, and titanium nitride (TiN) may serve as a plate node PN of a capacitor CAP, and tungsten nitride may be a low-resistance material.

The dielectric layer DE may be referred to as a capacitor dielectric layer. The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including at least zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (Hf)-based oxide. The dielectric layer DE may have a stack structure including at least hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy (which will be, hereinafter, referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater energy bandgap than the high-k material. The dielectric layer DE may include silicon oxide ($SiO_2$) as a high bandgap material other than aluminum oxide ($Al_2O_3$).

Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, it may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminated structure, or a mixed structure including zirconium oxide, hafnium oxide, and aluminum oxide.

According to another embodiment of the present invention, the dielectric layer DE may include a ferroelectric material or an antiferroelectric material.

According to another embodiment of the present invention, an interface control layer for improving leakage current may be further formed between the storage node SN and the dielectric layer DE. The interface control layer may include titanium oxide ($TiO_2$), niobium oxide, or niobium nitride. The interface control layer may also be formed between the plate node PN and the dielectric layer DE.

The capacitor CAP may include a metal-insulator-metal (MIM) capacitor. The storage node SN and the plate node PN may include a metal-based material.

The capacitor CAP may be replaced with another data storage material. For example, the data storage material may be a phase change material, a magnetic tunnel junction (MTJ), or a variable resistance material.

Referring back to FIG. 1, the word line DWL may include the word line edge portion WLE, and the contact plug WC may be coupled to the word line edge portion WLE. The word line edge portion WLE may refer to the edge portions of the first and second word lines WL1 and WL2. For example, the word line edge portion WLE may include a first word line edge portion WE1 and a second word line edge portion WE2. The word line edge portion WLE may further include a word line pad WLP between the first word line edge portion WE1 and the second word line edge portion WE2. The word line pad WLP may be laterally spaced apart from the active layer ACT in the third direction D3. The word line pad WLP may directly contact the first word line edge portion WE1 and the second word line edge portion WE2. The first word line edge portion WE1, the word line pad WLP, and the second word line edge portion WE2 may be vertically stacked in the first direction D1. An end portion of the word line edge portion WLE may include a vertical flat surface. Accordingly, the end of the word line pad WLP may be self-aligned with the end of the first word line edge portion WE1 and the end of the second word line edge portion WE2.

The first and second word line edge portions WE1 and WE2 may be formed of the same material as the first and second word lines WL1 and WL2. Each of the first and second word line edge portions WE1 and WE2 may include a metal, a metal mixture, a metal alloy, or a semiconductor material. Each of the first and second word line edge portions WE1 and WE2 may include titanium nitride, tungsten, polysilicon, or a combination thereof. For example, each of the first and second word line edge portions WE1 and WE2 may include a 'TiN/W stack' in which titanium nitride and tungsten are sequentially stacked.

The word line pad WLP may be formed of the same material as those of the first and second word line edge portions WE1 and WE2. The word line pad WLP may include a metal, a metal mixture, a metal alloy, or a semiconductor material. The word line pad WLP may include titanium nitride, tungsten, polysilicon, or a combination thereof. For example, the word line pad WLP may include a TiN/W stack in which titanium nitride and tungsten are sequentially stacked. The first word line edge portion WE1 and the second word line edge portion WE2 may be electrically connected to each other by the word line pad WLP.

When each of the word line pad WLP and the first and second word line edge portions WE1 and WE2 includes a TiN/W stack, the word line edge portion WLE may have a 'triple-TiN/W stack structure', which is a triple structure where three TiN/W stacks are stacked.

The contact plug WC may extend vertically in the first direction D1. The contact plug WC may be directly coupled to the second word line edge portion WLE2. The contact plug WC may include a metal-based material. The contact plug WC may include titanium nitride, tungsten, or a combination thereof.

Figure 3:
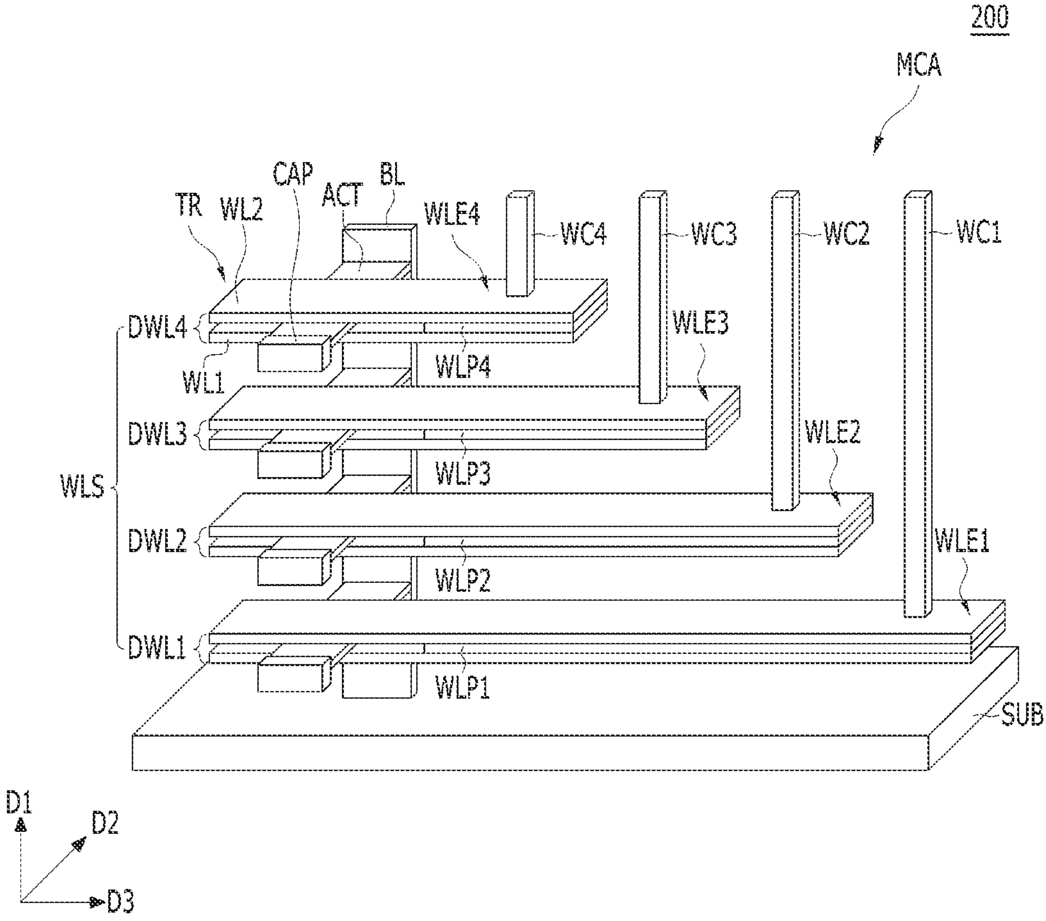
FIG. 3 is a schematic perspective view illustrating a semiconductor device in accordance with another embodiment of the present invention.
Figure 4:
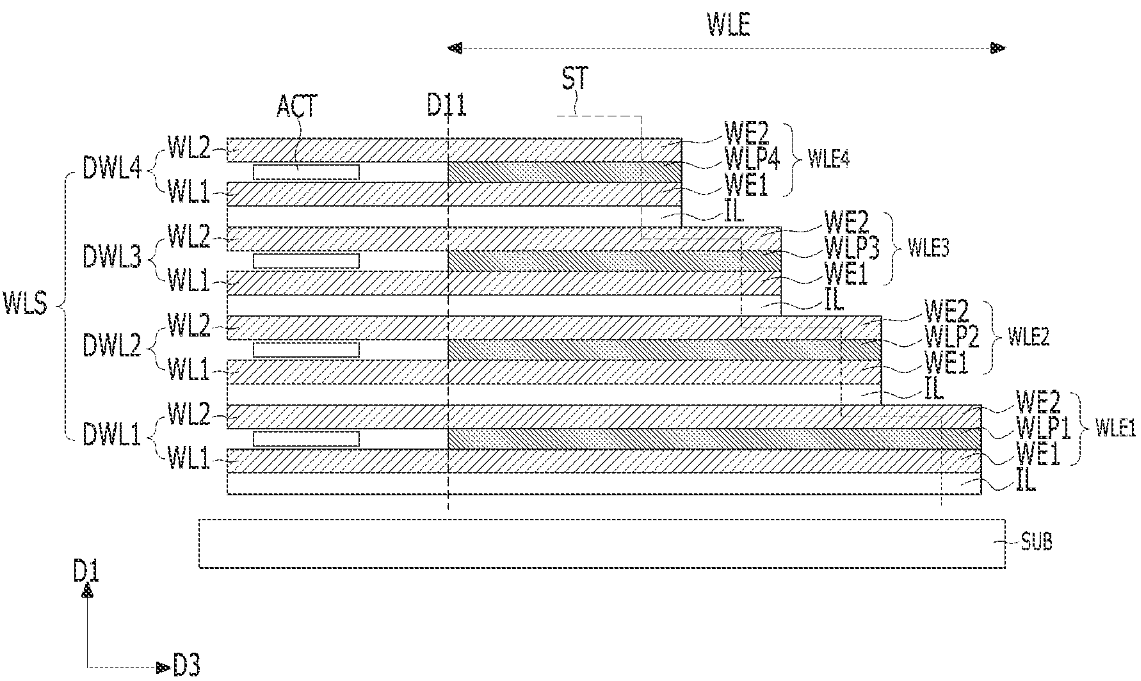
FIG. 4 is a schematic cross-sectional view illustrating the word line stack of FIG. 3.

FIG. 3 is a schematic perspective view illustrating a semiconductor device in accordance with another embodiment of the present invention. FIG. 4 is a schematic cross-sectional view illustrating a word line stack WLS shown in FIG. 3.

Referring to FIGS. 3 and 4, the semiconductor device 200 may include a memory cell array MCA. The memory cell array MCA may include a plurality of memory cells. Herein, the memory cells of the memory cell array MCA may include the memory cells MC shown in FIGS. 1 and 2. As shown in FIG. 3, the memory cells MC shown in FIGS. 1 and 2 may be vertically stacked a plurality of times in the first direction D1.

The memory cell array MCA may include a plurality of active layers ACT and a plurality of word lines DWL1 to DWL4 that are vertically stacked over the substrate SUB. Each of the word lines DWL1 to DWL4 may have a double word line structure. In other words, each of the word lines DWL1 to DWL4 may include first and second word lines WL1 and WL2 that are facing each other with the active layer ACT interposed therebetween. The word lines DWL1 to DWL4 may be vertically stacked in the first direction D1 from the surface of the substrate SUB. The stack of the word lines DWL1 to DWL4 may be referred to as a 'word line stack WLS'.

The memory cell array MCA may further include a bit line BL, a plurality of transistors TR, and a plurality of capacitors CAP over the substrate SUB. Each of the transistors TR may include an active layer ACT and word lines DWL1 to DWL4. The word lines DWL1 to DWL4 may extend laterally in the third direction D3.

The word line stack WLS may include a word line edge portion WLE. The word line edge portion WLE may refer to the edge portions of the word lines DWL1 to DWL4. The word line edge portions WLE may include stepped word line edge portions WLE1 to WLE4. Contact plugs WC1 to WC4 may be respectively coupled to the word line edge portions WLE1 to WLE4. The word line edge portions WLE may refer to the edge portions of the first and second word lines WL1 and WL2. Each of the word line edge portions WLE1 to WLE4 may include a first word line edge portion WE1 and a second word line edge portion WE2. The word line edge portions WLE1 to WLE4 may further include word line pads WLP1 to WLP4, respectively. The word line pads WLP1 to WLP4 may be laterally spaced apart from the active layers ACT. The individual word line pads WLP1 to WLP4 may be formed between the first word line edge portions WE1 and the second word line edge portions WE2. The word line pads WLP1 to WLP4 may directly contact the first and second word line edge portions WE1 and WE2.

First ends of the word line edge portions WLE1 to WLE4 may be aligned vertically at D11. The first ends of the word line pads WLP1 to WLP4 may be aligned vertically at D11. In each of the word line pads WLP1 to WLP4, second ends of the word line pads WLP1 to WLP4 may be self-aligned to the ends of the first and second word line edge portions WE1 and WE2.

The word line edge portion WLE of the word line stack WLS may have a step shape (refer to reference symbol 'ST'). The second ends of the word line edge portions WLE1 to WLE4 may not be aligned to each other. For example, the second ends of the word line edge portions WLE1 to WLE4 may not be aligned to each other in the step shape ST.

The word line pads WLP1 to WLP4 may extend laterally in the third direction D3. The word line pads WLP1 to WLP4 may have different lengths in the lateral direction. The lengths of the word line pads WLP1 to WLP4 in the lateral direction may gradually decrease from the lowermost word line pad WLP1 toward the highest word line pad WLP4.

A lateral conductive line having a '⊃' shape may be formed by combining the individual word lines DWL1 to DWL4 and the individual word line pads WLP1 to WLP4.

The method for forming the word line pads WLP1 to WLP4 may include forming a pad-type recess by removing the materials (e.g., a dielectric material, and a semiconductor material) that are disposed between the first word line edge portion WE1 and the second word line edge portion WE2 and thereafter filling the pad-type recess with a conductive material.

The word line stack WLS may further include inter-layer dielectric layers IL, and the inter-layer dielectric layers IL may be disposed between the word line edge portions WLE1 to WLE4. The inter-layer dielectric layers IL may extend laterally to be disposed between the word lines DWL1 to DWL4. The inter-layer dielectric layers IL may extend laterally in the third direction D3. The inter-layer dielectric layers IL may have different lengths in the lateral direction. The lengths of the inter-layer dielectric layers IL in the lateral direction may gradually decrease from the lowermost inter-layer dielectric layer IL to the uppermost inter-layer dielectric layer IL. The lengths of the word lines DWL1 to DWL4 in the lateral direction may be the same as the length of the inter-layer dielectric layer IL in the lateral direction.

As described above, since the word line pads WLP1 to WLP4 are respectively formed between the first word line edge portions WE1 and the second word line edge portions WE2, the resistance of the word lines DWL1 to DWL4 may be improved. Also, it is possible to prevent the contact plugs WC1 to WC4 from being punched by the word line pads WLP1 to WLP4.

Figure 5A:
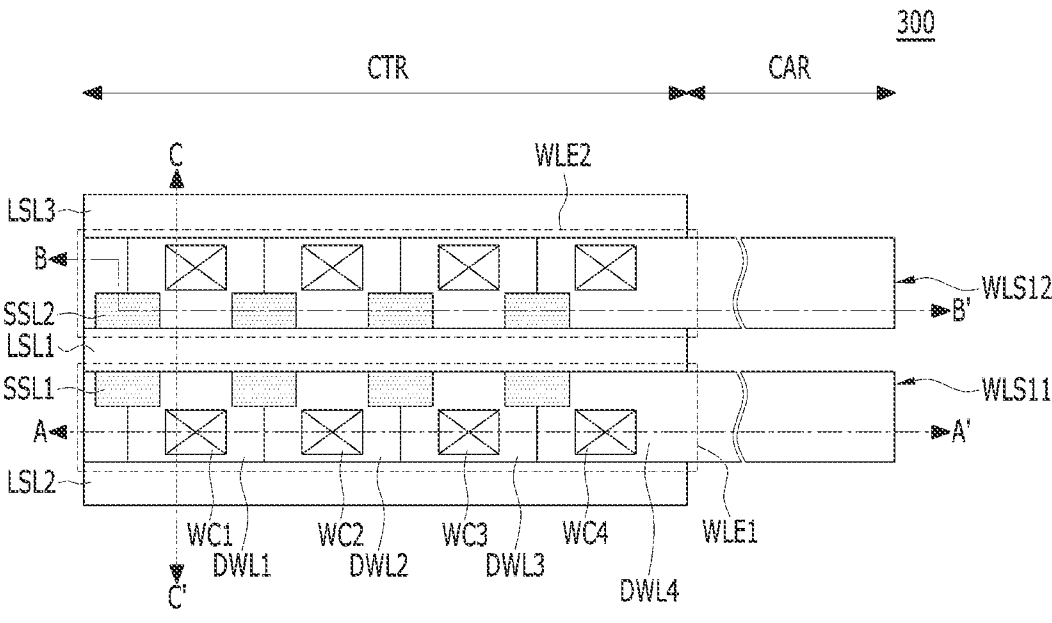
FIG. 5*a* is a schematic plan view illustrating a semiconductor device in accordance with still another embodiment of the present invention.
Figure 5A:
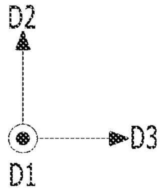
Figure 5B:
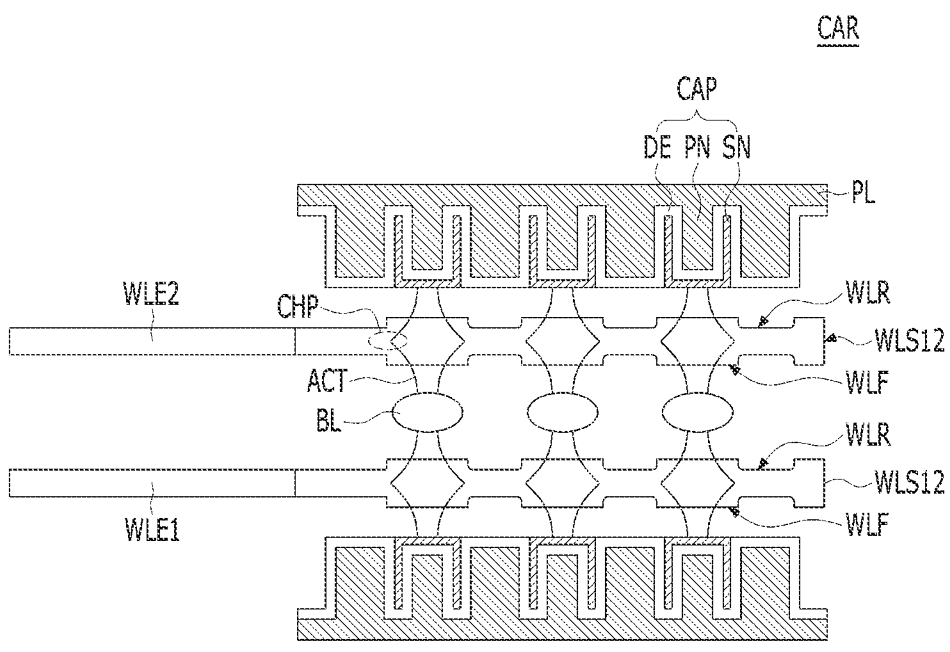
FIG. 5*b* is a detailed layout view of a cell array unit shown in FIG. 5*a*.
Figure 5B:
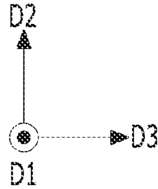
Figure 6:
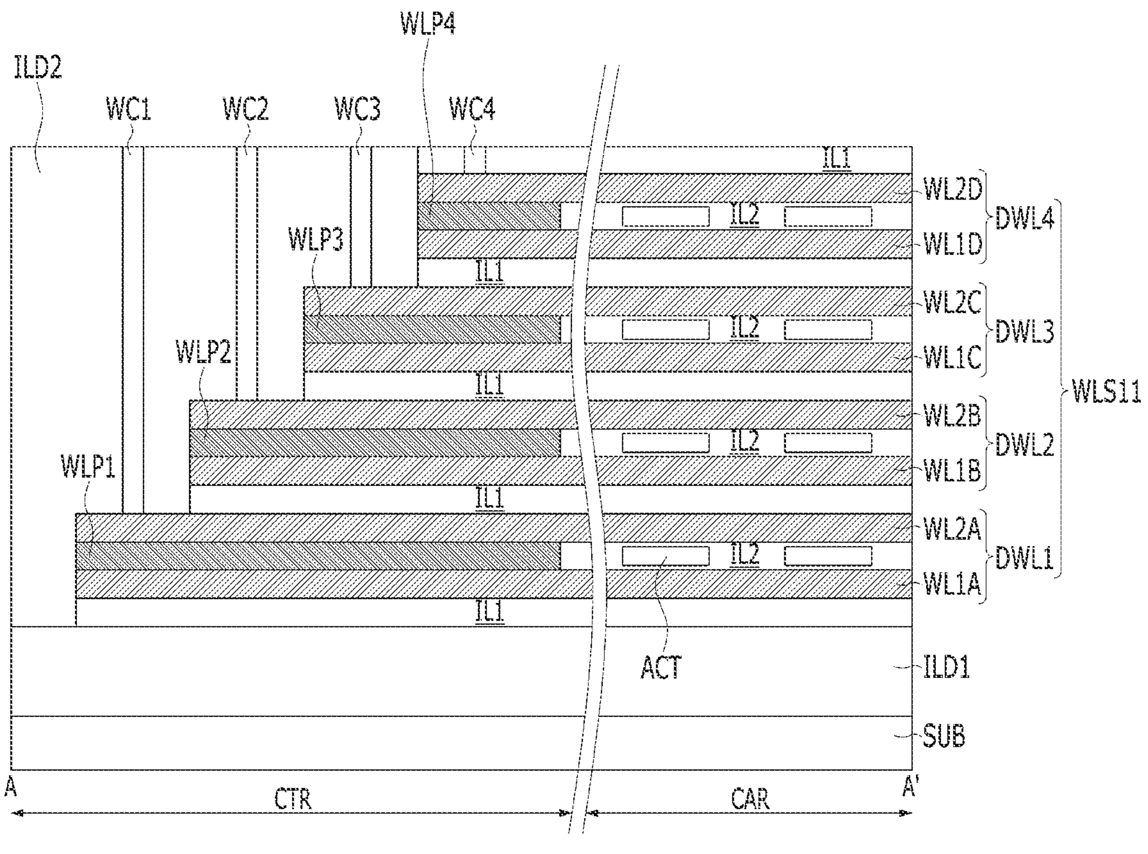
FIG. 6 is a cross-sectional view taken along a line A-A' of FIG. 5*a*.
Figure 6:
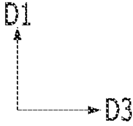
Figure 7:
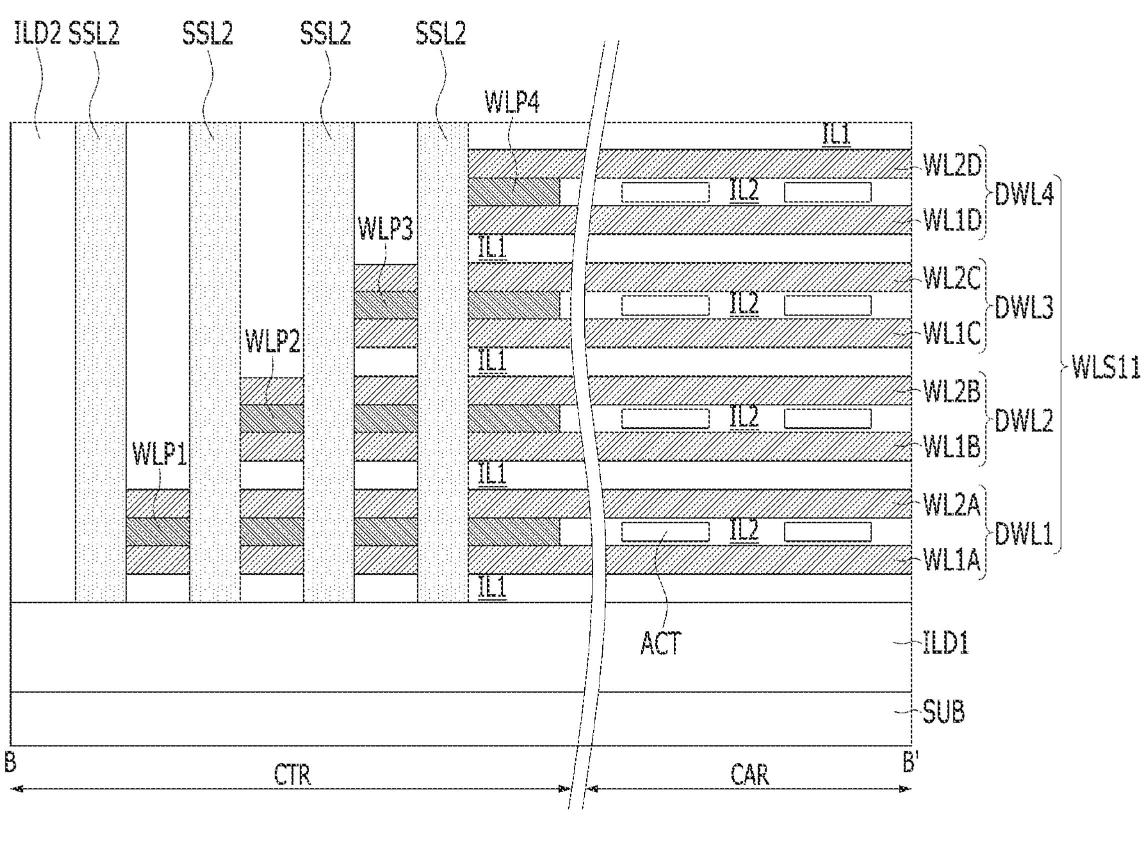
FIG. 7 is a cross-sectional view taken along a line B-B' of FIG. 5*a*.
Figure 8:
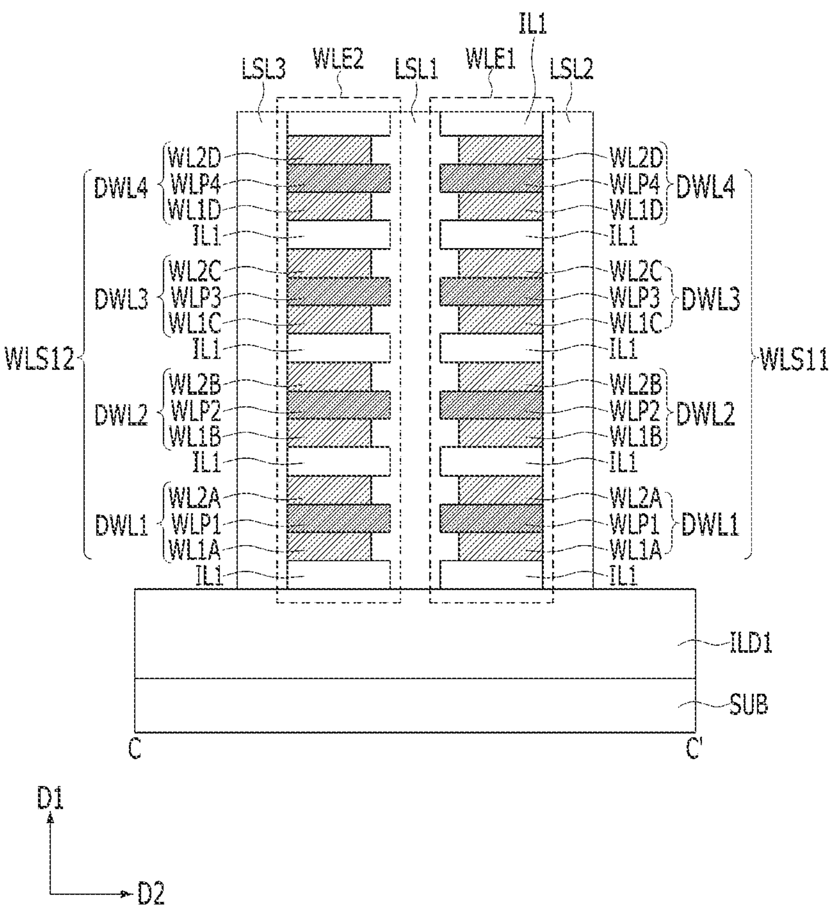
FIG. 8 is a cross-sectional view taken along a line C-C' of FIG. 5*a*.

FIG. 5*a* is a schematic plan view illustrating a semiconductor device in accordance with another embodiment of the present invention. FIG. 5*b* is a detailed layout view illustrating a cell array unit shown in FIG. 5*a*. FIG. 6 is a cross-sectional view taken along a line A-A' of FIG. 5*a*. FIG. 7 is a cross-sectional view taken along a line B-B' of FIG. 5*a*. FIG. 8 is a cross-sectional view taken along a line C-C' of FIG. 5*a*. In FIGS. 5*a* to 8, detailed descriptions on the constituent elements that also appear in FIGS. 1 to 4 will be omitted.

Referring to FIGS. 5*a* to 8, the semiconductor device 300 may include a cell array unit CAR and a contact unit CTR. The memory cells MC of the memory cell array MCA as shown in FIGS. 3 and 4 may be disposed in the cell array unit CAR, and the word line edge portion WLE of the memory cell array MCA as shown in FIGS. 3 and 4 may be disposed in the contact unit CTR. A plurality of contact plugs WC1 to WC4 may be further disposed in the contact unit CTR. The semiconductor device 300 may include a plurality of word line stacks WLS11 and WLS12, and each of the word line stacks WLS11 and WLS12 may include a plurality of word lines DWL1 to DWL4. The word lines DWL1 to DWL4 may be vertically stacked in the first direction D1. The word lines DWL1 to DWL4 may extend laterally in the third direction D3.

The word line stacks WLS11 and WLS12 may include word line edge portions WLE1 and WLE2, respectively. Each of the word line edge portions WLE1 and WLE2 may have a step shape, and the step shape may be defined in the contact unit CTR. A plurality of word line pads WLP1 to WLP4 may be disposed in the contact unit CTR. The word line pads WLP1 to WLP4 may extend laterally in the third direction D3. The lateral length may gradually decrease from the lowermost word line pad WLP1 toward the uppermost word line pad WLP4. The contact plugs WC1 to WC4 may be respectively coupled to the word line edge portions WLE1 and WLE2.

The semiconductor device 300 may further include large slits LSL1, LSL2, and LSL3, and the large slits LSL1, LSL2, and LSL3 may extend in the third direction D3. The large slits LSL1, LSL2, and LSL3 may be referred to as a first word line edge slit. The word line stacks WLS11 and WLS12 may be disposed between the large slits LSL1, LSL2, and LSL3 in the second direction D2. For example, the first large slit LSL1 may be disposed between the first word line stack WLS11 and the second word line stack WLS12, and the first word line stack WLS11 may be disposed between the first large slit LSL1 and the second large slit LSL2, and the second word line stack WLS12 may be disposed between the first large slit LSL1 and the third large slit LSL3. The first large slit LSL1 may be referred to as a 'word line isolation slit.

The semiconductor device 300 may further include small slits SSL1 and SSL2. The small slits may be referred to as a second word line edge slit. The small slits SSL1 and SSL2 may extend vertically in the first direction D1 and may contact the one-side sidewalls of the word line edge portions WLE1 and WLE2, respectively. The small slits SSL1 and SSL2 may directly contact the one-side sidewalls of the word line edge portions WLE1 and WLE2. The first small slits SSL1 may directly contact the one-side sidewall of the first word line edge portion WLE1, and the second small slits SSL2 may directly contact the one-side sidewall of the second word line edge portion WLE2. The first and second small slits SSL1 and SSL2 may directly contact the first large slit LSL1.

The word line edge portions WLE1 and WLE2 and the word line pads WLP1 to WLP4 may be supported by the large slits LSL1, LSL2 and LSL3 and the small slits SSL1 and SSL2. The large slits LSL1, LSL2, and LSL3 and the small slits SSL1 and SSL2 may be referred to as 'supporters'. The large slits LSL1, LSL2, and LSL3 and the small slits SSL1 and SSL2 may be formed of a dielectric material.

Referring back to FIG. 8, each of the word lines DWL1 to DWL4 may have a double word line structure. For example, each of the word lines DWL1 to DWL4 may include first word lines WL1A to WL1D and second word lines WL2A to WL2D.

The first large slit LSL1 may include a plurality of protrusions that directly contact the first and second word lines WL1A to WL1D and WL2A to WL2D. The lateral lengths of the first and second word lines WL1A to WL1D and WL2A to WL2D in the second direction D2 may be smaller than the lateral lengths of the word line pads WLP1 to WLP4 in the second direction D2.

The first and second word line stacks WLS11 and WSL12 may be disposed over the substrate SUB, and a first inter-layer dielectric layer ILD1 may be disposed between the first and second word line stacks WLS11 and WLS12 and the substrate SUB.

The first and second word line stacks WLS11 and WLS12 may include multi-level word lines DWL1 to DWL4. A first level word line DWL1 may include a first word line WL1A and a second word line WL2A. A second level word line DWL2 may include a first word line WL1B and a second word line WL2B. A third level word line DWL3 may include a first word line WL1C and a second word line WL2C. A fourth level word line DWL4 may include a first word line WL1D and a second word line WL2D. A first lateral level dielectric layer IL1 may be disposed between the word lines DWL1 to DWL4. In the cell array unit CAR, a plurality of active layers ACT may be disposed between the first word lines WL1A to WL1D and the second word lines WL2A to WL2D. A second lateral level dielectric layer IL2 may be disposed between the active layers ACT in the cell array unit CAR. In the contact unit CTR, word line pads WLP1 to WLP4 may be disposed between the first word lines WL1A to WL1D and the second word lines WL2A to WL2D. Contact plugs WC1 to WC4 may be coupled to the second word lines WL2A to WL2D, respectively. The contact plugs WC1 to WC4 may penetrate the second inter-layer dielectric layer ILD2. The second inter-layer dielectric layer ILD2 may cover the word line edge portions WLE1 and WLE2 of the word line stacks WLS11 and WLS12.

FIG. 5b is a detailed plan view of the cell array unit CAR, in which the cell array unit CAR may include first and second word line stacks WLS11 and WLS12, active layers ACT, bit lines BL, capacitors CAP and plate lines PL. The bit lines BL may extend vertically in the first direction D1. The active layers ACT may extend laterally in the second direction D2. The first and second word line stacks WLS11 and WLS12 may extend laterally in the third direction D3. The cell array unit CAR may have a mirror-type structure in which the bit lines BL are shared.

Referring back to FIGS. 5a and 5b, the first and second word line stacks WLS11 and WLS12 in the cell array unit CAR may include a notch-shaped sidewall from the perspective of a plan view. The sidewalls of the word line edge portions WLE1 and WLE2 of the first and second word line stacks WLS11 and WLS12 extending from the cell array unit CAR may have a linear shape. Each of the word line stacks WLS11 and WLS12 of the cell array unit CAR may include a notch-shaped sidewall extending in the third direction D3 and facing each other. In other words, the word lines DWL1 to DWL4, the first word lines WL1A to WL1D, and the second word lines WL2A to WL2D may also include notch-shaped sidewalls extending in the third direction D3. Each of the notch-shaped sidewalls may include flat surfaces WLF and recessed surfaces WLR. The flat surfaces WLF and the recessed surfaces WLR may be alternately repeated in the third direction D3. The flat surfaces WLF may be flat sidewalls, and the recessed surfaces WLR may be recessed sidewalls.

In the first word line stack WLS11, the distance between the flat surfaces WLF facing each other in the second direction D2 may be greater than the distance between the recessed surfaces WLR facing each other in the second direction D2. According to another embodiment of the present invention, the recessed surfaces WLR may have a round shape. For example, the recessed surfaces WLR may have a hemispherical notch shape individually and may be symmetrical to each other in the second direction D2.

In the contact unit CTR, the sidewalls of the word line edge portions WLE1 and WLE2 of the first and second word line stacks WLS11 and WLS12 may have a linear shape in which flat surfaces extend.

The active layer ACT may include channel protrusions CHP, and the channel protrusions CHP may vertically overlap with the first and second word line stacks WLS11 and WLS12. The active layer ACT may have a rhombus shape.

Figure 9:
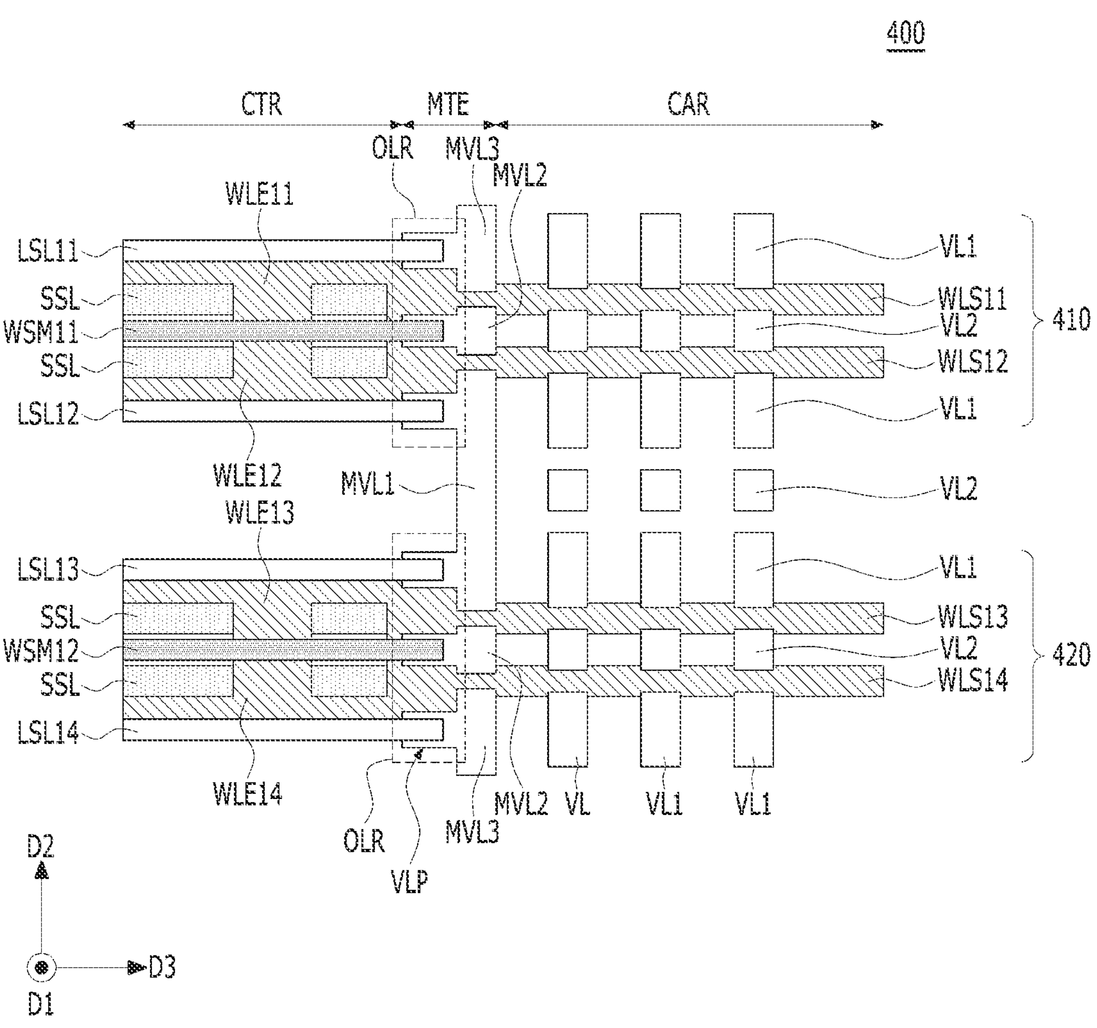
FIG. 9 is a schematic plan view illustrating a semiconductor device in accordance with yet another embodiment of the present invention.

FIG. 9 is a schematic plan view illustrating a semiconductor device in accordance with another embodiment of the present invention. Hereinafter, the semiconductor device 400 of FIG. 9 may be similar to the semiconductor devices 100, 200, and 300 of the above-described embodiments.

Referring to FIG. 9, the semiconductor device 400 may include a cell array unit CAR, a contact unit CTR, and a cell array edge portion MTE. A plurality of word line stacks WLS11, WLS12, WLS13, and WLS14 may be disposed in the cell array unit CAR, and word line edge portions WLE11 to WLE14 may be disposed in the contact unit CTR. Each of the word line stacks WLS11 to WLS14 may include a plurality of word lines DWL1 to DWL4 as shown in FIGS. 5a to 8. The word lines DWL1 to DWL4 may be vertically stacked in the first direction D1. The word lines DWL1 to DWL4 may extend laterally in the third direction D3.

The word line stacks WLS11 to WLS14 may include the word line edge portions WLE11 to WLE14, respectively. Each of the word line edge portions WLE11 to WLE14 may have a step shape as shown in FIGS. 5a to 8, and the step shape may be defined in the contact unit CTR. As shown in FIGS. 5a to 8, a plurality of word line pads WLP1 to WLP4 may be disposed in the contact unit CTR, and each of the word line edge portions WLE11 to WLE14 may include word line pads WLP1 to WLP4. Each of the word line edge portions WLE11 to WLE14 may extend laterally in the third direction D3. The lateral length may gradually decrease from the lowermost word line pad WLP1 toward the uppermost word line pad WLP4.

The semiconductor device 400 may include a first array group 410 and a second array group 420. The first array group 410 may include a first word line isolation slit WSM11 and first and second large slits LSL11 and LSL12. The first word line isolation slit WSM11 and the first and second large slits LSL11 and LSL12 may extend in the third direction D3. The first and second word line edge portions WLE11 to WLE12 may be disposed between the first and second large slits LSL11 and LSL12 in the second direction D2. For example, a first word line isolation slit WSM11 may be disposed between the first word line edge portion WLE11 and the second word line edge portion WLE12, and the first the first word line edge portion WLE11 may be disposed between the first large slit LSL11 and the first word line isolation slit WSM11, and the second word line edge portion WLE12 may be disposed between the second large slit LSL12 and the first word line isolation slit WSM11.

The second array group 420 may include a second word line isolation slit WSM12 and third and fourth large slits LSL13 and LSL14. The second word line isolation slit WSM12 and the third and fourth large slits LSL13 and LSL14 may extend in the third direction D3. The large slits LSL11, LSL22, LSL13 and LSL14 may be referred to as a first word line edge slit or linear-shape edge slit. The third and fourth word line edge portions WLE13 to WLE14 may be disposed between the third and fourth large slits LSL13 and LSL14 in the second direction D2. For example, the second word line isolation slit WSM12 may be disposed between the third word line edge portion WLE13 and the fourth word line edge portion WLE14, and the third word line edge portion WLE13 may be disposed between the third large slit LSL13 and the second word line isolation slit WSM12, and the fourth word line edge portion WLE14 may be disposed between the fourth large slit LSL14 and the second word line isolation slit WSM12. The first array group 410 may include a first linear edge slit LSL11; a second linear edge slit LSL12; a first word line isolation slit WSM11; a first word line stack WLS11 disposed between the first linear edge slit LSL11 and the first word line isolation slit WSM11; a second word line stack WLS12 disposed between the second linear edge slit LSL12 and the first word line isolation slit WSM11; and a plurality of vertical isolation layers MVL1, MVL1, MVL3 having protrusions overlapping with respective edges of the first linear edge slit LSL11, the second linear edge slit LSL12, and the first word line isolation slit WSM11. The second array group 420 may include a third linear edge slit LSL13; a fourth linear edge slit LSL14; a second word line isolation slit WSM12; a third word line stack WLS13 disposed between the third linear edge slit LSL13 and the second word line isolation slit WSM12; a fourth word line stack WLS14 disposed between the fourth linear edge slit LSL14 and the second word line isolation slit WSM12; and a plurality of vertical isolation layers MVL1, MVL1, MVL3 having protrusions overlapping with respective edges of the third linear edge slit LSL13, the fourth linear edge slit LSL14, and the second word line isolation slit WSM 12.

The semiconductor device 400 may further include small slits SSL. The small slits SSL may extend vertically in the first direction D1. The small slits SSL may be referred to as a second word line edge slit or pillar-shape edge slit. The small slits SSL may directly contact the word line edge portions WLE11 to WLE14. The small slits SSL may not directly contact the first and second word line isolation slits WSM11 and WSM12.

The first to fourth large slits LSL11 to LSL14 and the small slits SSL may also be referred to as supporters supporting the stacked word lines. The first to fourth large slits LSL11 to LSL14 and the small slits SSL may be formed of a dielectric material.

The first to fourth large slits LSL11 to LSL14 may also be referred to as cell isolation slits. For example, the first large slit LSL11 and the second large slit LSL12 may be spaced apart from each other with the first word line isolation slit WSM11 interposed therebetween. The third large slit LSL13 and the fourth large slit LSL14 may be spaced apart from each other with the second word line isolation slit WSM12 interposed therebetween.

The semiconductor device 400 may further include (as shown in FIG. 9) a plurality of first vertical isolation layers MVL1, MVL2, and MVL3 that are disposed in the cell array edge portion MTE. Each of the first vertical isolation layers MVL1, MVL2, and MVL3 may include protrusions VLP. The semiconductor device 400 may further include a plurality of second vertical isolation layers VL1 and VL2 that are disposed in a cell array unit CAR. The first vertical isolation layers MVL1, MVL2, and MVL3 may include large vertical isolation layers MVL1 and MVL3 overlapping with the first to fourth large slits LSL11 to LSL14 and small vertical isolation layers MVL2 overlapping with the first and second word line isolation slits WSM11 and WM12. The large vertical isolation layers MVL1 and MVL3 may be referred to as a first edge vertical isolation layer. The small vertical isolation layers MVL2 may be referred to as a second edge vertical isolation layer. The second vertical isolation layers VL1 and VL2 may be referred to as a vertical cell isolation layer. The second vertical isolation layers VL1 and VL2 disposed laterally spaced apart from the first vertical isolation layers MVL1, MVL2 and MVL3. The second vertical isolation layers VL1 and VL2 disposed between the first word line stack and the second word line stack in the cell array unit CAR.

The first vertical isolation layers MVL1, MVL2 and MVL3 and the second vertical isolation layers VL1 and VL2 may support the word line stacks WLS11 to WLS14 and the word line edge portions WLE11 to WLE14. The second vertical isolation layers VL1 and VL2 and the first vertical isolation layers MVL1, MVL2 and MVL3 may include a dielectric material.

In the cell array edge portion MTE, the large vertical isolation layers MVL1 and MVL3 and the first to fourth large slits LSL11 to LSL14 may overlap with each other. For example, in the overlap region OLR, ends of the first to fourth large slits LSL11 to LSL14 may vertically overlap with the protrusions VLP of the large vertical isolation layers MVL1 and MVL3. Cross-sections of the large vertical isolation layers MVL1 and MVL3 may have a layout of a protruding shape. For example, the cross-sections of the large vertical isolation layers MVL1 and MVL3 may have a '├' shape, a '╞' shape, or a 'comb' shape.

In the cell array edge portion MTE, the small vertical isolation layers MVL2 and the first and second word line isolation slits WSM11 and WSM12 may overlap with each other. For example, in the overlap region OLR, ends of the first and second word line isolation slits WSM11 and WSM12 may vertically overlap the protrusions VLP of the small vertical isolation layers MVL2. The cross-sections of the small vertical isolation layers MVL2 may have a layout of a protruding shape. For example, the cross sections of the small vertical isolation layers MVL2 may have a '├' shape, a '╞' shape, or a 'comb' shape.

Referring to FIG. 9, since the small vertical isolation layers MVL2 and the word line isolation slits WSM11 and WSM12 overlap and the large vertical isolation layers MVL1 and MVL3 and the first to fourth large slits LSL11 to LSL14 overlap, the slope of the etch profile according to etch loading in the cell array edge portion MTE may be improved.

Also, since the cross-sections of the first vertical isolation layers MVL1, MVL2, and MVL3 have a layout of a protruding shape in the overlap region OLR, the overlap margin may be secured.

Also, since the small vertical isolation layers MVL2 and the word line isolation slits WSM11 and WSM12 overlap and the large vertical isolation layers MVL1 and MVL3 and the first to fourth large slits LSL11 to LSL14 overlap, it is possible to prevent bridging (electrical shorting) of the word line pads.

To reduce the etch loading, the second vertical isolation layers VL1 and VL2 and the first vertical isolation layers MVL1, MVL2 and MVL3 may have the same width. In other words, the second vertical isolation layers VL1 and VL2 and the first vertical isolation layers MVL1, MVL2 and MVL3 may have the same width in the third direction D3.

Figure 10:
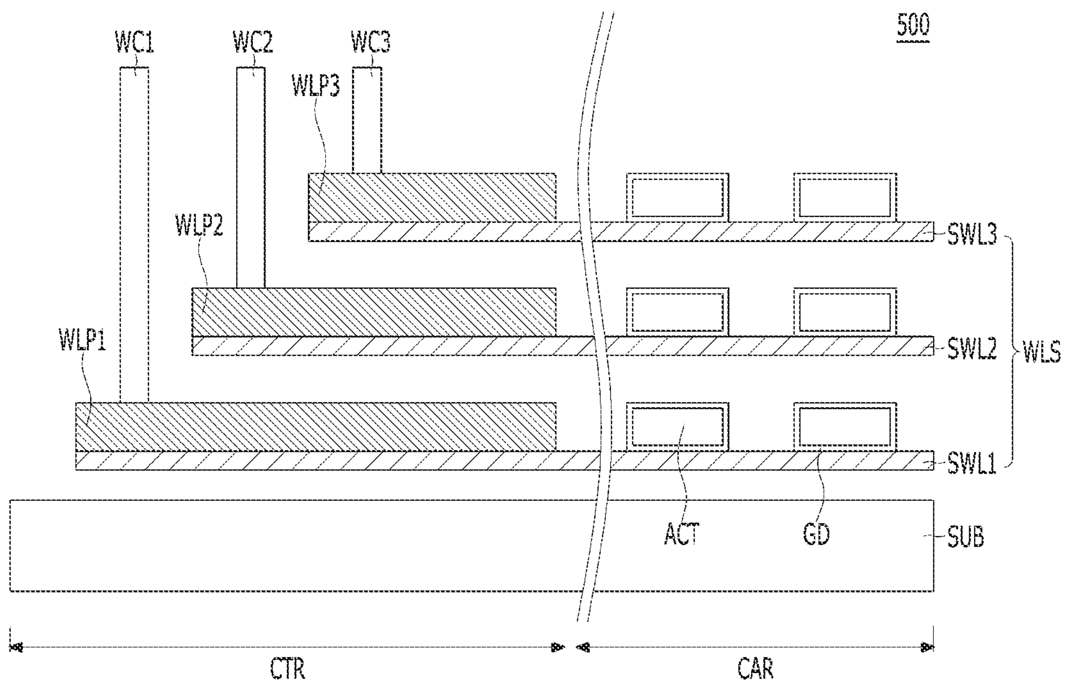
FIGS. 10 and 11 are schematic cross-sectional views illustrating semiconductor devices in accordance with other embodiments of the present invention.
Figure 10:
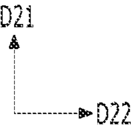
Figure 11:
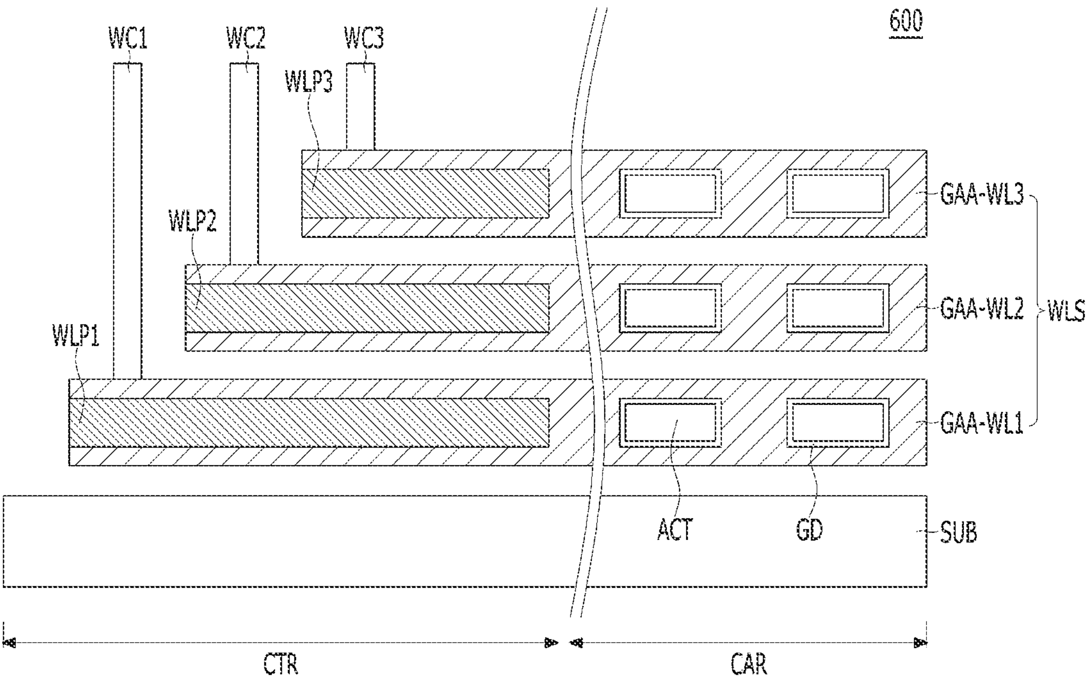
Figure 11:
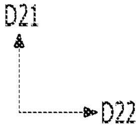

FIGS. 10 and 11 are schematic cross-sectional views illustrating semiconductor devices in accordance with other embodiments of the present invention.

The semiconductor device 500 shown in FIG. 10 may be similar to the semiconductor devices illustrated in FIGS. 1 to 9. Hereinafter, as for the detailed description of the constituent elements also appearing in FIGS. 1 to 9, FIGS. 1 to 9 and the accompanying descriptions may be referred to. In FIG. 10, a first direction D21 may correspond to the first direction D1 of FIG. 1, and a second direction D22 may correspond to the third direction D3 of FIG. 1.

Referring to FIG. 10, the semiconductor device 500 may include a word line stack WLS, and the word line stack WLS may include a plurality of single word lines SWL1 to SWL3. The single word lines SWL1 to SWL3 may be vertically stacked in the first direction D21. The single word lines SWL1 to SWL3 may extend laterally in the second direction D22. A gate dielectric layer GD may be disposed between the single word lines SWL1 to SWL3 and the active layers ACT.

The semiconductor device 500 may include a cell array unit CAR and a contact unit CTR. The word line stack WLS may be disposed in the cell array unit CAR, and word line pads WLP1, WLP2, and WLP3 may be disposed in the contact unit CTR.

A plurality of word line pads WLP1 to WLP3 may be disposed in the contact unit CTR. The word line pads WLP1 to WLP3 may provide a step shape. The word line pads WLP1 to WLP3 may extend laterally in the second direction D22. The lateral length may gradually decrease from the lowermost word line pad WLP1 toward the uppermost word line pad WLP3. Contact plugs WC1, WC2, and WC3 may be respectively coupled to the word line pads WLP1 to WLP3. The word line pads WLP1 to WLP3 may have different lateral lengths in the second direction D22. Each of the single word lines SWL1 to SWL3 may be thinner than the word line pads WLP1 to WLP3. For example, when comparing the vertical heights in the first direction D21, the single word lines SWL1 to SWL3 may have a thickness smaller than the thicknesses of the word line pads WLP1 to WLP3.

The semiconductor device 600 of FIG. 11 may include a word line stack WLS, and the word line stack WLS may include a plurality of gate all-around word lines GAA-WL1 to GAA-WL3. The gate all-around word lines GAA-WL1 to GAA-WL3 may be vertically stacked in the first direction D21. The gate all-around word lines GAA-WL1 to GAA-WL3 may extend laterally in the second direction D22. The gate all-around word lines GAA-WL1 to GAA-WL3 may surround the neighboring active layers ACT in the second direction D22, and the gate dielectric layers GD may contact the active layers ACT.

The semiconductor device 600 may include a cell array unit CAR and a contact unit CTR. The word line stack WLS may be disposed in the cell array unit CAR, and word line pads WLP1, WLP2, and WLP3 may be disposed in the contact unit CTR.

A plurality of the word line pads WLP1 to WLP3 may be disposed in the contact unit CTR. The word line pads WLP1 to WLP3 may provide a step shape. The word line pads WLP1 to WLP3 may extend laterally in the second direction D22. The lateral length may gradually decrease from the lowermost word line pad WLP1 toward the uppermost word line pad WLP3. Contact plugs WC1, WC2, and WC3 may be respectively coupled to the word line pads WLP1 to WLP3. The word line pads WLP1 to WLP3 may have different lateral lengths in the second direction D22. Each of the edge portions of the gate all-around word lines GAA-WL1 to GAA-WL3 may cover the word line pads WLP1 to WLP3.

According to one embodiment of the present invention, since the vertical isolation layer and the word line isolation slits overlap with each other and the vertical isolation layers and the large slits overlap with each other at an edge portion of a cell array, the slope of the etch profile originating from etch loading at the edge portion of the cell array may be improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
- a first word line stack in which first word lines are vertically stacked;
- a second word line stack in which second word lines are vertically stacked;
- a word line isolation slit disposed between the first word line stack and the second word line stack; and
- a plurality of first vertical isolation layers spaced apart from each other and disposed between the first word line stack and the second word line stack, each first vertical isolation layer overlapping with the word line isolation slit.

2. The semiconductor device of claim 1, further comprising:
- a second vertical isolation layer laterally spaced apart from each first vertical isolation layer and disposed between the first word line stack and the second word line stack.

3. The semiconductor device of claim 1, wherein each first vertical isolation layer includes
- a protrusion overlapping with the word line isolation slit.

4. The semiconductor device of claim 1, wherein at least one of the plurality of first vertical isolation layers and the word line isolation slit, includes a dielectric material.

5. The semiconductor device of claim 1, further comprising:
- an active layer;
- a bit line coupled to one side of the active layer and oriented vertically; and
- a capacitor coupled to another side of the active layer,
- wherein each of the first word line stack and the second word line stack comprises double word lines that are facing each other with the active layer interposed therebetween.

6. The semiconductor device of claim 1, wherein the first and second word line stacks comprise portions of a memory cell array of a Dynamic Random Access Memory (DRAM).

7. The semiconductor device of claim 1, wherein
- the first word line stack includes a stepped first word line edge portion,
- the second word line stack includes a stepped second word line edge portion, and
- the word line isolation slit is disposed between the first word line edge portion and the second word line edge portion.

8. The semiconductor device of claim 1, wherein at least one of the first word line stack and the second word line stack includes
- stepped word line pads that are facing each other with the word line isolation slit interposed therebetween.

9. The semiconductor device of claim 8, further comprising:

word line edge slits contacting the stepped word line pads and facing each other with the word line isolation slit interposed therebetween.

10. The semiconductor device of claim 1, further comprising:

a first cell isolation slit which is disposed adjacent to the first word line stack;

a second cell isolation slit which is disposed adjacent to the second word line stack; and edge vertical isolation layers overlapping with one-side ends of the first and second cell isolation slits.

11. The semiconductor device of claim 10, wherein the edge vertical isolation layers include a protrusion overlapping with the one-side ends of the first and second cell isolation slits.

12. The semiconductor device of claim 10, wherein at least one of the edge vertical isolation layers and the first and second cell isolation slits includes a dielectric material.

13. A semiconductor device, comprising:

a first linear edge slit;

a second linear edge slit;

a word line isolation slit;

a first word line stack disposed between the first linear edge slit and the word line isolation slit;

a second word line stack disposed between the first linear edge slit and the word line isolation slit; and a plurality of vertical isolation layers having protrusions overlapping with respective edges of the first linear edge slit, the second linear edge slit, the word line isolation slit.

14. The semiconductor device of claim 13, further comprising:

vertical cell isolation layers laterally spaced apart from the vertical isolation layers and disposed between the first word line stack and the second word line stack.

15. The semiconductor device of claim 13, wherein at least one or more of the first linear edge slit, the second linear edge slit, the word line isolation slit, and the vertical isolation layer comprises a dielectric material.

16. The semiconductor device of claim 13, wherein each of the first and second word line stacks comprise plural word line stacks stacked in a vertical direction with an inter-layer dielectric in between.

17. The semiconductor device of claim 13, further comprising:

an active layer;

a bit line coupled to one side of the active layer and oriented vertically; and a capacitor coupled to another side of the active layer, wherein each of the first word line stack and the second word line stack comprises double word lines that are facing each other with the active layer interposed therebetween.

18. The semiconductor device of claim 13, wherein the first and second word line stacks comprise portions of a memory cell array of a Dynamic Random Access Memory (DRAM).

19. The semiconductor device of claim 13, wherein at least one of the first word line stack and the second word line stack includes stepped word line pads that are facing each other with the word line isolation slit interposed therebetween.

20. The semiconductor device of claim 19, further comprising:

supporters contacting the stepped word line pads and facing each other with the word line isolation slit interposed therebetween.

* * * * *